United States Patent [19]
Huang et al.

[11] Patent Number: 5,798,535
[45] Date of Patent: Aug. 25, 1998

[54] MONOLITHIC INTEGRATION OF COMPLEMENTARY TRANSISTORS AND AN LED ARRAY

[75] Inventors: Rong-Ting Huang, Gilbert; Phil Wright, Scottsdale; Chan-Long Shieh, Paradise Valley, all of Ariz.

[73] Assignee: Motorola, Inc., Schaumburg, Ill.

[21] Appl. No.: 771,763

[22] Filed: Dec. 20, 1996

[51] Int. Cl.$^6$ .................. H01L 27/15; H01L 31/12; H01L 33/00; H01L 31/153
[52] U.S. Cl. .................. 257/83; 257/84; 257/88
[58] Field of Search .................. 257/83, 84

[56] References Cited
U.S. PATENT DOCUMENTS

4,006,298  2/1977  Fowler et al. .
5,550,818  8/1996  Brackett et al. .
5,679,964  10/1997  Kobayashi et al. .

Primary Examiner—Stephen Meier
Attorney, Agent, or Firm—Eugene A. Parsons

[57] ABSTRACT

Monolithic integrated transistors and a light emitting diode matrix epitaxially grown on a semiconductor substrate. The matrix includes a plurality of LEDs organized into rows and columns, the LEDs being formed of layers of semiconductor material epitaxially grown on the substrate. A row driver for each row includes a transistor coupled to the matrix and a column driver for each column includes a complementary transistor coupled to the matrix. The transistor and the complementary transistor are each an HBT including layers of semiconductor material positioned on the semiconductor material forming the matrix.

17 Claims, 5 Drawing Sheets

| $C_N$ | $A_0$ | $\overline{A_0}$ | $A_1$ | $\overline{A_1}$ | COLUMN SELECTED | |
|---|---|---|---|---|---|---|
| 1 | 0 | 1 | 0 | 1 | 0 | ~31 |
| 1 | 0 | 1 | 1 | 0 | 1 | ~32 |
| 1 | 1 | 0 | 0 | 1 | 2 | ~33 |
| 1 | 1 | 0 | 1 | 0 | 3 | ~34 |

FIG. 3
30

| $R_N$ | $B_0$ | $\overline{B_0}$ | $B_1$ | $\overline{B_1}$ | ROW SELECTED | |
|---|---|---|---|---|---|---|
| 1 | 0 | 1 | 0 | 1 | 0 | ~41 |
| 1 | 0 | 1 | 1 | 0 | 1 | ~42 |
| 1 | 1 | 0 | 0 | 1 | 2 | ~43 |
| 1 | 1 | 0 | 1 | 0 | 3 | ~44 |

MONOLITHIC INTEGRATION OF COMPLEMENTARY TRANSISTORS AND AN LED ARRAY

FIELD OF THE INVENTION

The present invention pertains to arrays of light emitting devices and more particularly to a novel drive circuitry for the array.

BACKGROUND OF THE INVENTION

Displays utilizing two dimensional arrays, or matrices, of pixels each containing one or more light emitting devices are very popular in the electronic field and especially in portable electronic and communication devices, because large amounts of data and pictures can be transmitted very rapidly and to virtually any location.

Matrix addressing techniques are well known in the art and have been utilized to control various types of displays such as light emitting diode displays, liquid crystal device (LCD) displays, and field emission device (FED) displays. Matrix addressing schemes typically organize the light emitting elements or pixels into a number of rows and columns with each pixel at an intersection of a particular row and a particular column. Illuminating the pixel requires activating an intersecting row and column thereby providing a closed current path that includes the pixel to be illuminated.

Image information is generally supplied to the LED driver circuitry memory by way of a data input and is stored in a predetermined location by means of an address supplied to the address input. The stored data is supplied to the LED display a complete row at a time by way of a latch/column driver. Each bit of data for each column in the row is accessed in memory and transferred to a latch circuit. The current data is then supplied to the column drivers to drive each pixel in the row simultaneously. At the same time, a shift register sequentially selects a new row of data each time a pulse is received from a clock. The newly selected row of pixels is actuated by row drivers so that data supplied to the same pixels by a latch/column driver causes the pixel to emit the required amount of light.

It should also be noted that an LED matrix display could be a simple monochrome configuration, a display utilizing monochrome grayscale, or color. For a simple monochrome display, only a one bit digital signal is needed for each pixel, as the pixel is either on or off. For a display utilizing monochrome grayscale, either an analog signal or a multi-bit digital signal is required. A sixteen level grayscale, for example, needs a four bit digital signal. Full color, generally requires at least three light emitting elements per pixel, one for each of the basic colors (red, green and blue), and a type of grayscale signal system to achieve the appropriate amount of each color. Thus, full color displays contain three times as many column drivers, which at least triples the manufacturing cost of the display. Also, the additional drivers require additional space and power, which can be a problem in portable electronic devices, such as pagers, cellular and regular telephones, radios, data banks, etc.

As described above, the columns and rows of the LED matrix require drivers for each individual column or row with additional latching circuits for the column drivers. In the prior art the column and row drivers are so complicated they can not easily be integrated onto a common substrate with the LED array. The specific configuration is generally dictated by the size of the LED array, which then determines the amount of space remaining on the supporting substrate. It of course is understood that the supporting substrate must be a convenient size, since overly large semiconductor chips result in a great deal of lost chips and labor because of defects in the chips during manufacturing. Also, the known prior art drivers require many additional manufacturing steps for their integration, which results in much additional labor and cost, as well as the opportunity for many additional defects. If the drivers are placed on a different chip, the configuration is heavily dependent on a large number of I/O terminal counts and the circuit becomes burdensome and not conducive to miniaturization.

Accordingly, it would be advantageous to be able to manufacture displays, and especially color displays, with simpler data drivers and with fewer I/O terminals.

It is an object of the present invention to provide new and improved driven matrices of light emitting devices using digital data drivers.

It is another object of the present invention to provide new and improved driven matrices of light emitting devices using fewer data drivers.

It is a further object of the present invention to provide matrix display and driver circuitry which utilizes substantially less power than equivalent prior art displays.

It is still a further object of the present invention to provide improvements in decoding switches of monolithic matrices of LEDs.

It is still a further object of the present invention to provide LED displays which are less expensive, smaller, and easier to manufacture.

It is yet a further object of the present invention to provide LED displays which integrate decoding switches for column and row selection in a monolithic integrated array.

It is still another object of the present invention to provide LED displays with reduced I/O terminal count for column and row selection in LED matrices.

SUMMARY OF THE INVENTION

The above described problems and others are at least partially solved and the above described purpose and others are realized in display apparatus including monolithic integrated transistor drivers and a light emitting device matrix having a semiconductor substrate with a light emitting diode matrix formed on the substrate and including a plurality of light emitting diodes organized into a plurality of rows and columns. The display apparatus further includes a row driver including a transistor coupled to the matrix and a column driver including a complementary transistor coupled to the matrix. The transistor and the complementary transistor each are a heterojunction bipolar transistor (HBT) including semiconductor material positioned on the semiconductor material forming the matrix, whereby the drivers are easily integrated onto the substrate with few additional process steps.

The above described problems and others are at least partially solved and the above described purpose and others are further realized in a method of fabricating monolithic integrated transistor drivers and a light emitting device matrix including the steps of forming a matrix on a semiconductor substrate, including positioning a first semiconductor material on the substrate and isolating areas within the first semiconductor material to define a plurality of light emitting diodes with each light emitting diode having a first contact and a second contact, and organizing the first contacts into a plurality of rows of first contacts and the second contacts into a plurality of columns of second contacts. The method further includes the steps of forming a plurality of row driving circuits including positioning a second semiconductor material on the first semiconductor material and isolating areas within the second semiconductor material to define a transistor for each row driving circuit having a current carrying terminal coupled to a row of the plurality of rows of first contacts. Further, the method includes the steps of forming a plurality of column driving circuits, including positioning a third semiconductor material on the second semiconductor material and isolating areas within the third semiconductor material to define a complementary transistor for each column driving circuit having a voltage supplying terminal coupled to a column of the plurality of columns of second contacts. It will of course be understood that the various growing, isolating, and defining steps can be performed in any convenient order and are described and claimed in a specific order only for purposes of explanation.

BRIEF DESCRIPTION OF THE DRAWINGS

Referring to the drawings.

DESCRIPTION OF A PREFERRED EMBODIMENT

Figure 1:
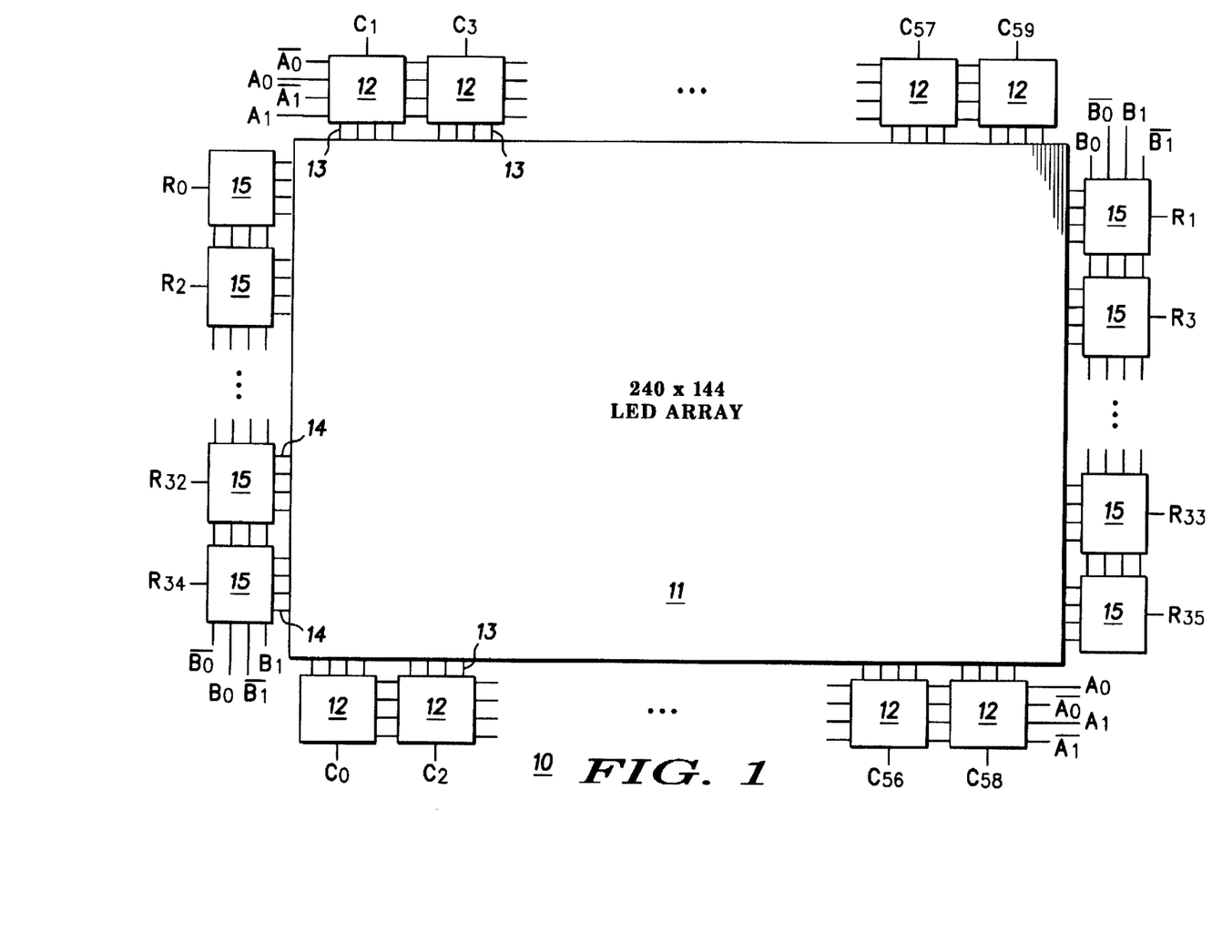
FIG. 1 is a simplified block diagram illustrating monolithic integrated transistor drivers and a light emitting device matrix in accordance with the present invention.

Turning now to the drawings in which like reference characters indicate corresponding elements throughout the several views, attention is first directed to FIG. 1 which illustrates an integrated display circuit 10. Integrated display circuit 10 includes an array 11 of, for example, 240 by 144 elements designated pixels, with each pixel having a unique column and row electrical connection. It will of course be understood that integrated display circuit 10 is being utilized for purposes of this explanation and could in fact include any of a large variety of arrays and specifically, different numbers of columns and rows and/or different types of devices.

As illustrated in this embodiment of the instant invention, a plurality of column decoding circuits 12 comprise 60 column signals, C0 through C59. Input signals C0 through C59 are designated as data signals and two pairs of complementary input signals, $A_0$, $\overline{A_0}$, $A_1$ and $\overline{A_1}$, are designated as address signals. Each column decoding circuit 12 is illustrated as having input signals $A_0$, $\overline{A_0}$, $A_1$, and $\overline{A_1}$, and one of C0 through C59 applied thereto. It will be understood that only two signals and their complements are used herein because generally a single circuit can generate each signal and its compliment, resulting in further saving of circuitry and chip area. Four individual (i.e. separate and distinct) column buses 13 of array 11 are coupled to each column decoding circuit 12, thereby the plurality of column decoding circuits 12 can address 60 by 4 for a total of 240 columns 13 of array 11. Column decoding circuits 12 are proposed for use with an LED array monolithically integrated with the decoding switches to simultaneously reduce the chip I/O count. All of column decoding circuits 12 used for column scanning have common address lines $A_0$, $\overline{A_0}$, $A_1$, and $\overline{A_1}$ coupled thereto.

Also illustrated in FIG. 1 is a plurality of row decoding circuits 15, each with an individual data line of a plurality of input data lines $R_0$ through $R_{35}$ coupled thereto (for a total of 36 row decoding circuits 15 in this embodiment). Four individual (i.e. separate and distinct) row buses 14 of array 11 are coupled to each row decoding circuit 15. Each row decoding circuit 15 is activated by the individual data signal $R_0$ through $R_{35}$ coupled thereto and by row address lines $B_0$, $\overline{B_0}$, $B_1$, and $\overline{B_1}$, which are coupled by way of common address lines to each of the row decoding circuits 15.

By the monolithic integration of low power column decoding circuits 12 and row decoding circuits 15 with LED array 11 on the same substrate, there is a great reduction in power dissipation. For instance, in a conventional decoder consisting of depletion mode MESFETs, the power expended for the aforementioned 240 by 144 LED array 11 is 11 watts compared to 36 milliwatts for LED integrated circuit 10 of the instant invention. The added reduction of I/O terminals, from 384 to 112 (in this specific example) illustrates the great improvement over an LED array without the integration of the decoding switches.

Figure 2:
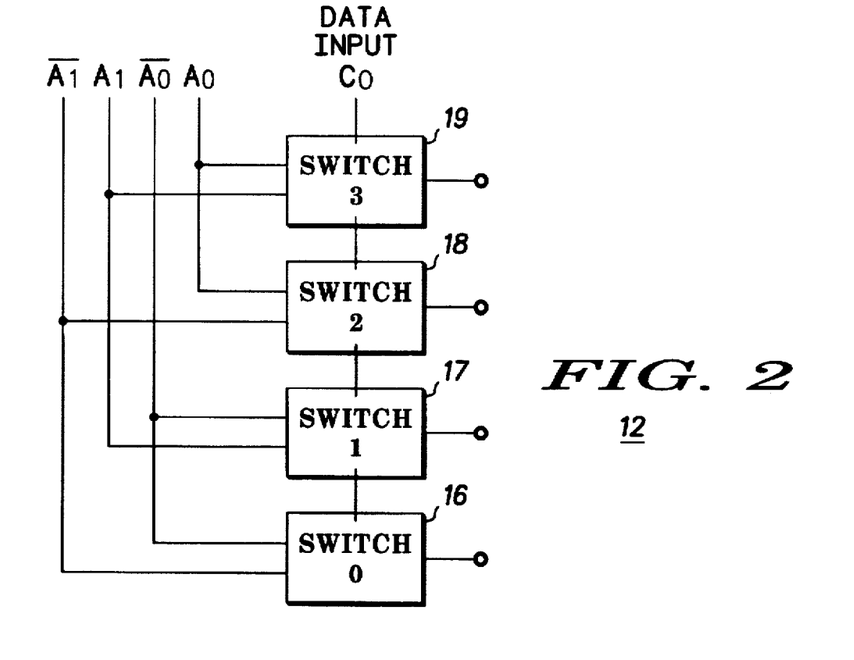
FIG. 2 is a simplified block diagram illustrating a plurality of LED array column decode switches used in the circuits of FIG. 1.
Figure 3:
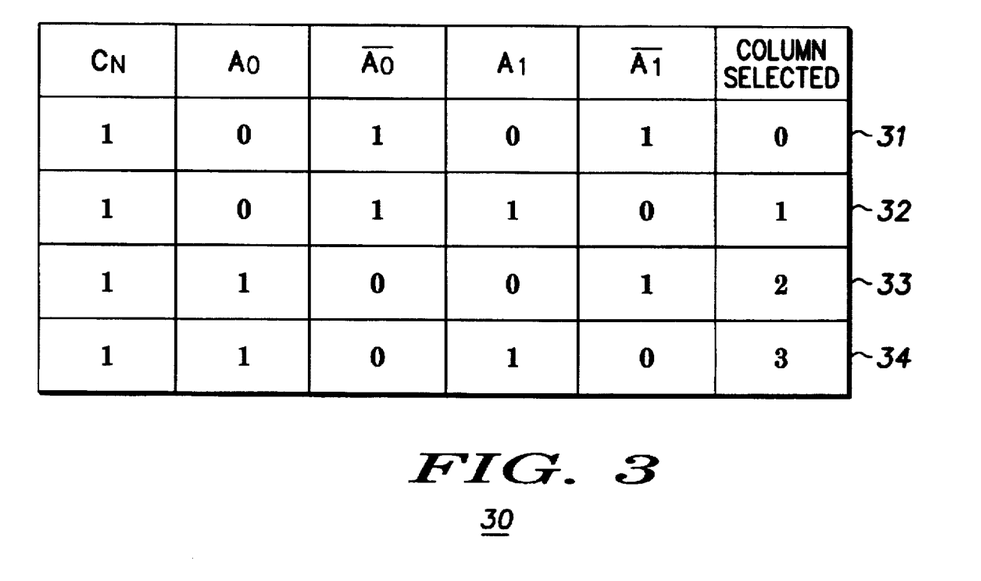
FIG. 3 illustrates a truth table for the LED array column decode switches illustrated in FIG. 2.
Figure 4:
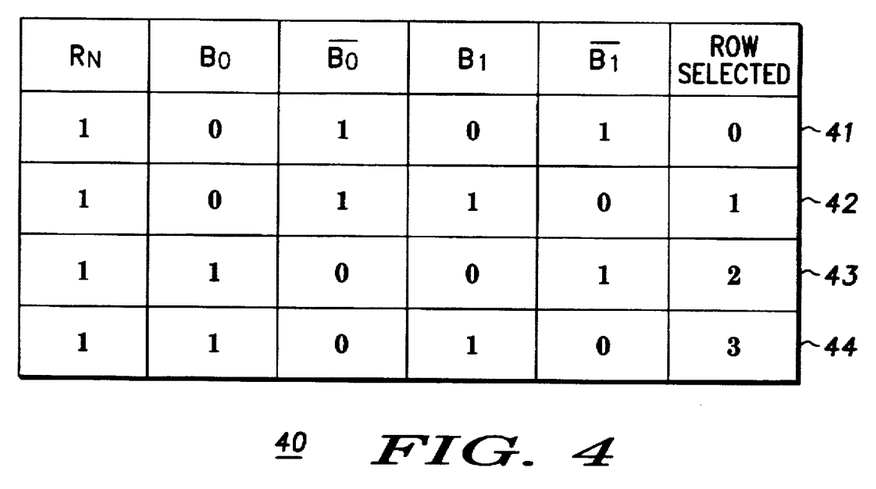
FIG. 4 illustrates a truth table for the LED array row decode switches.

Turning now to FIG. 2, a single column decoding circuit $12_n$ (connected to column n of array 11) is illustrated in block form. Column decoding circuit $12_n$ includes a plurality of column switches 16, 17, 18, and 19 connected to output a signal to one of column 0 through column 3 of LED array 11 in response to appropriate address signals. Associated with this illustration is a truth table 30 illustrated in FIG. 3 which truth table 30 illustrates the signal levels of each address line, $A_0$, $\overline{A_0}$, $A_1$, and $\overline{A_1}$ designated as a '1' or a '0', with column decoding circuit $12_n$ selected by a high data signal $C_n$ provided by the programmable power supply. Thus, any column decoding circuit 12 is selected by applying a logic high level signal to the associated data input $C_n$ and any of the columns attached to the selected decoding circuit $12_n$ are selected by utilizing an appropriate combination of address signals $A_0$, $\overline{A_0}$, $A_1$, and $\overline{A_1}$. FIG. 4 illustrates a selection logic truth table 40 for row decoding circuits $15_n$, which is similar to the column selection of truth table 30. A specific row decoding circuit $15_n$ is selected by supplying a logic high level signal to the associated data input $R_n$ and the selection of one of four rows attached thereto is accomplished by means of address lines $B_0$, $\overline{B_0}$, $B_1$, and $\overline{B_1}$.

Figure 5:
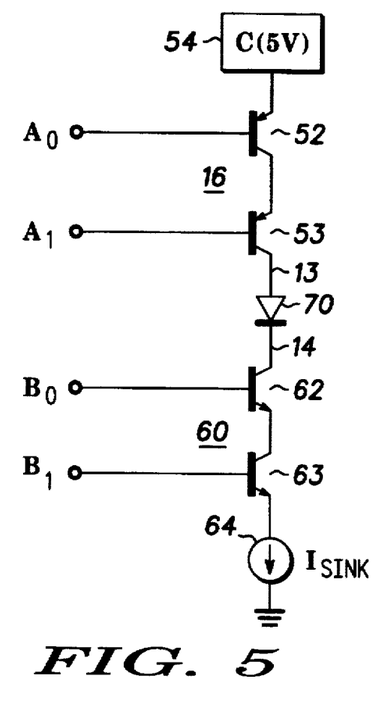
FIG. 5 is a schematic diagram illustrating a single column decode switch circuit, illustrated in block form in FIG. 2, an associated LED and a single row decode switch.

Turning now to FIG. 5, a single column switch, in this example column switch 16, of column decoding circuit 12 is illustrated schematically in series with a single row switch 60. As will be understood presently, each column decoding circuit 12 includes four column switches similar to switch 16 and each row decoding circuit 15 includes four row switches, similar to row switch 60. Column switch 16 includes two switching transistors 52 and 53 connected in series between programmable power supply 54 and a specific column bus 13 of array 11. In this specific embodiment, programmable power supply 54 is coupled to the input of selected column decoder switches 12 as data signal $C_n$. In this specific column circuit, address line $A_0$ is connected to the base of transistor 52. Transistor 52 couples a 5 volt potential, provided by means of programmable power supply 54, to second transistor 53 when a high logic level is present on address line $A_0$. Transistor 52 does not couple the 5 volt potential to transistor 53 when address signal $A_0$ is a low logic level.

Address line $A_1$ is connected to the base of transistor 53. In this embodiment, transistors 52 and 53 are p-n-p transistors. The advantage of using p-n-p transistors for column decoding circuits is to simplify the design of logic levels for address lines $A_0$, $\overline{A_0}$, $A_1$, and $\overline{A_1}$. Because p-n-p transistors are utilized, the address lines are connected directly to the bases of transistors 52 and 53 to turn transistors 52 and 53 ON and OFF, whereby the voltage at terminal 54 is supplied to an LED or not. As illustrated, transistor 53 conducts when address line $A_1$ is at a high level and couples the 5 volt potential from transistor 52 to the associated column bus 13 of array 11. A low logic level on address line A1 prevents transistor 53 from conducting.

Row switch 60 includes two n-p-n transistors 62 and 63 connected in series between an associated row bus 14 of array 11 and a current sink 64. In this specific embodiment, current sink 64 is coupled to the input of selected row decoding circuits 15 as data signal $R_n$. Transistor 62 couples the associated row bus 14 of array 11 to transistor 63 when address line $B_0$ applies a logic high level signal to the gate. Address line $B_1$ must be at a logic high level to activate transistor 63 to complete an electrical circuit to current sink 64. Current sink 64 is electrically coupled to transistor 63 as a logic high level signal applied to data line $R_n$. Current sink 64 must be electrically connected to allow current to flow through row switch 60. Electrical conductivity from the associated row bus 14 of array 11 to current sink 64 completes an electrical circuit from power supply 54 through column switch 16, column bus 13, an associated LED, designated 70, row bus 14 and row switch 60 to current sink 64.

Figure 6:
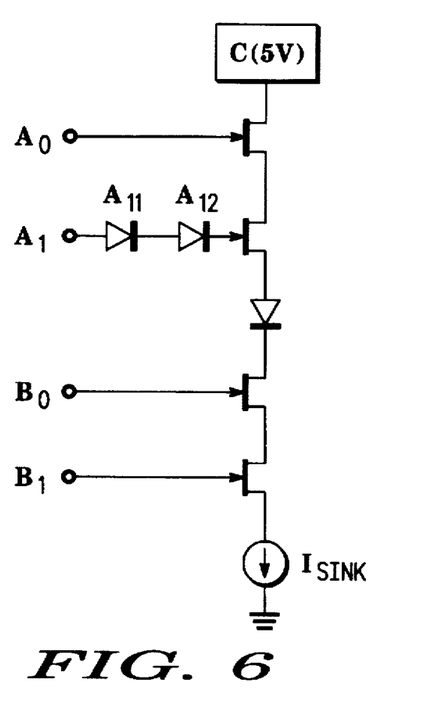
FIG. 6 is a schematic diagram, similar to FIG. 5, illustrating the circuitry with MESFETs.

While the embodiment of column switch 16 and row switch 60 in FIG. 5 includes Heterojunction Bipolar Transistors (HBT) as the transistors, it should be understood that other types of switching transistors may be conveniently used. For example, a different embodiment of this circuit is illustrated in FIG. 6 in which MESFETs are used as the switching transistors. In the FIG. 5 embodiment, the HBTs are fabricated on the semiconductor substrate with very few additional process steps. Moreover, the decode switch consisting of HBTs only needs a single power supply for circuit operation.

Figure 7:
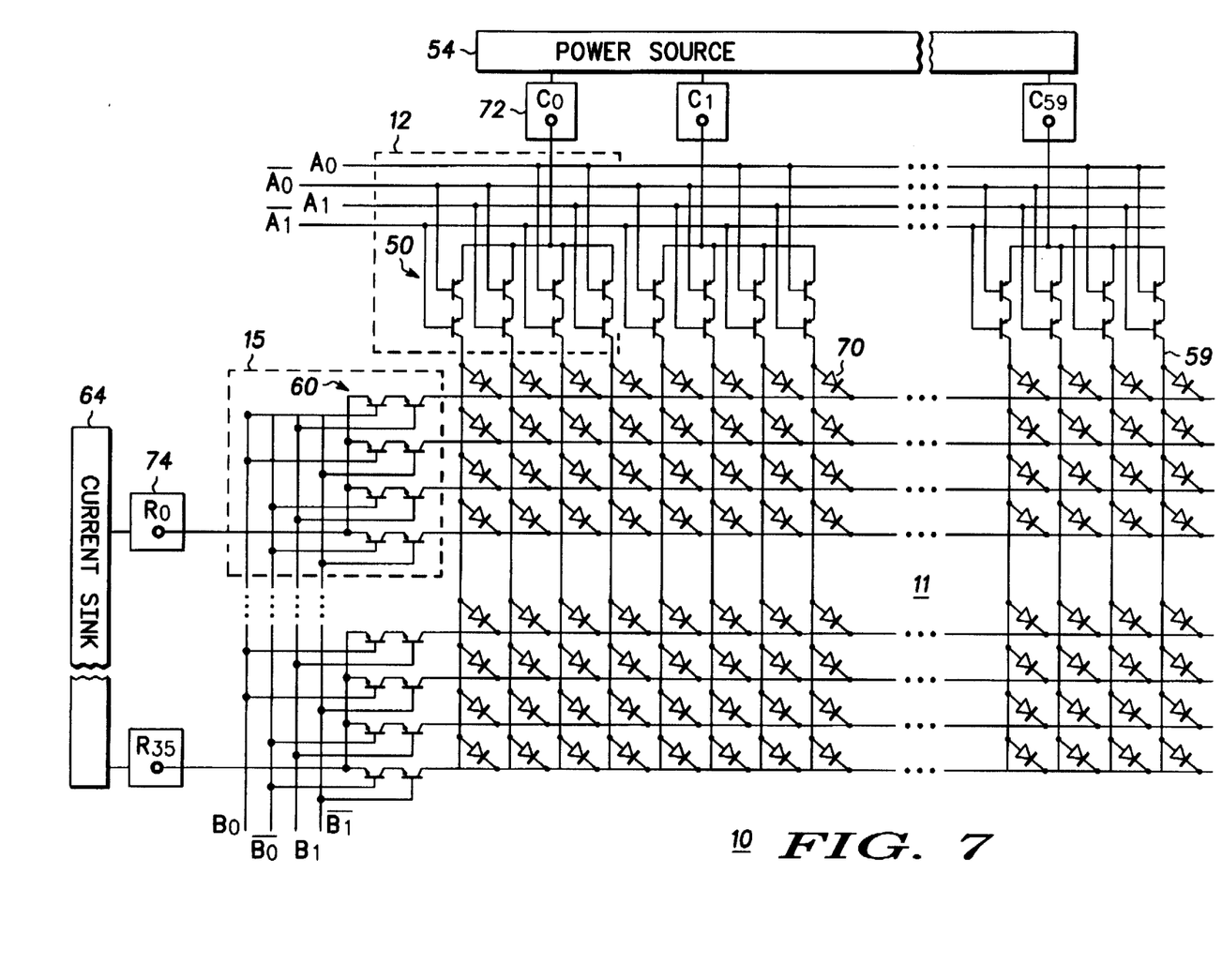
FIG. 7 is a schematic diagram illustrating the monolithic light emitting diode (LED) array with driving circuits of FIG. 1.

Referring now to FIG. 7, LED array integrated circuit 10 is illustrated schematically, with portions thereof removed, for simplification. Integrated circuit 10 includes a plurality of LED's 70 in LED matrix array 11. As an example, one terminal of a specific LED 70 is electrically connected to a first column switch 50 (illustrated individually in FIG. 5) of a first column decoding circuit 12, enclosed in a broken line for convenience of viewing. A second terminal of LED 70 is connected to a first row switch 60 (illustrated individually in FIG. 5) in row decoding circuit 15, enclosed in a broken line for convenience of viewing, as a singular illustration of a plurality of column decoding circuits 12 and a plurality of row decoding circuits 15 utilized to activate the plurality of columns and rows of LED array 11. This figure illustrates the four LED circuit arrangement of FIG. 2, wherein one column decoding circuit 12 activates four column buses 13 by connecting programmable power source 54 to the addressed column bus 13, with a corresponding row decoding circuit 15 completing the circuit by electrically connecting an addressed row bus 14 from a four row decoding circuit 15 to current sink 64. Column switch 50 is connected to programmable power source 54 on data line $C_0$ by a switch or circuit within programmable power source 54 (illustrated as a block 72), or by otherwise completing a circuit to programmable power source 54. Similarly, row switch 60 is connected to programmable current sink 64 on data line $R_0$ by a switch or circuit within programmable current sink 64 (illustrated as a block 74), or by otherwise completing a circuit to current sink 64.

It should be understood that programmable power source 54 and programmable current sink 64, in addition to being programmable as to the amount of power supplied at any predetermined time, may also be programmed to sequence automatically through a predetermined program of input signals on data lines $C_0$ through $C_{59}$ and through a predetermined program of input signals on data lines $R_0$ through $R_{35}$.

Figure 8:
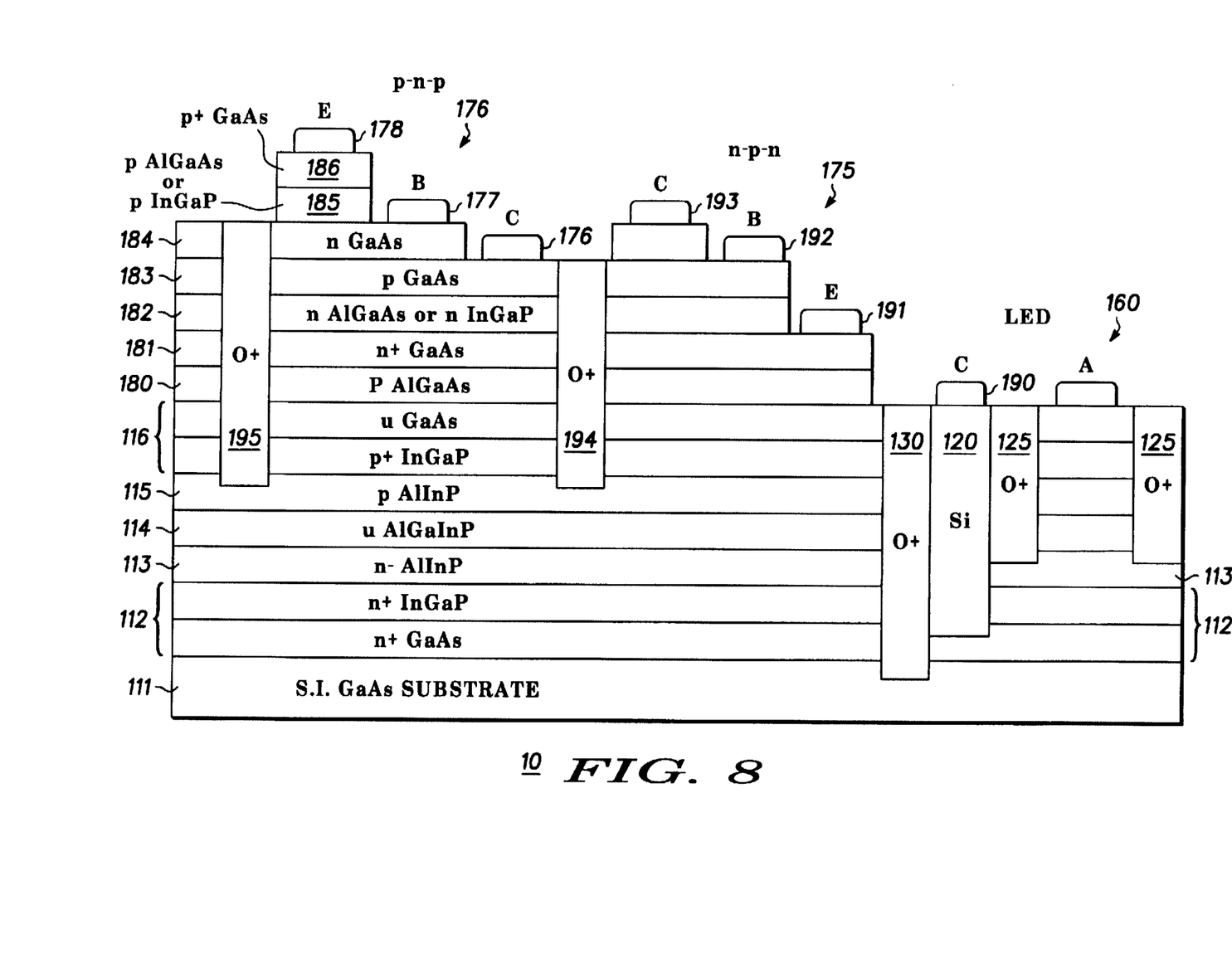
FIG. 8 is a simplified cross-sectional view illustrating one embodiment of an integrated epi-structure for complementary heterojunction bipolar transistors and LEDs.

Turning now to FIG. 8, a simplified cross-sectional view of monolithic integrated transistors and a light emitting diode matrix forming display 10 are illustrated. In this example a single LED 160 represents diode matrix 11 and a single pair of complementary HBTs 175 and 176 represent column decoding circuits 12 and row decoding circuits 15. LED 160 will be described initially, for convenience and because it forms the basis for HBTs 175 and 176, as will be clear presently. The structure includes a substrate 111 having a heavily doped conductive portion 112 formed thereon. In this embodiment, area 112 includes two layers or areas which provide a sort of grading or lattice matching of the materials. A first carrier confinement layer 113, an active layer (or layers) 114 and a second carrier confinement layer 115 are formed on conductive layer 112 using any known method. Carrier confinement layer 113, active layer 114 and carrier confinement layer 115 are the materials which are eventually separated, or isolated, into a plurality of light emitting diodes 160. A conductive cap portion, which in this example is again a pair of lattice matching layers, 116 is formed on second confinement layer 115. Conductive layer 112 and cap portion 116 provide electrical contacts to opposite sides of the light emitting diodes.

In a specific example, substrate 111 is formed of undoped gallium arsenide (GaAs) to form a semi-insulating semiconductor substrate. Conductive layer 112 is a relatively heavily doped portion (n+) of GaAs phasing into InGaP, epitaxially grown on the surface of substrate 111. Carrier confinement layer 113 is an epitaxially grown layer of aluminum-indium-phosphide (AlInP) doped to provide N-type semiconductivity. Active layer 114 is an epitaxially grown layer of AlGaInP formed in a manner well known in the art so that further description is believed to be unnecessary. Carrier confinement layer 115 is an epitaxially grown layer of AlInP doped to provide P-type semiconductivity. Cap layer portion 116 includes two epitaxially grown layers of InGaP heavily doped to provide P+-type conductivity and a p-type conducting layer of GaAs. It will of course be understood that the various layers can be provided in many other forms and the present embodiment is disclosed because of the simplicity of formation. Also, in some embodiments additional layers are provided, or omitted, for various special applications and it should be understood that the disclosed structure is intended as a basic structure for purposes of this disclosure and not as a limitation.

While it will be understood that the structure of FIG. 8 can be fabricated utilizing a number of various steps and procedures, the following example is utilized as one of the methods requiring the fewest steps. After the formation of the various layers utilized in the fabrication of LED array 11 (LED 160), an isolating and etch stop layer 180 is epitaxially grown on cap layer 116. A contact layer 181 is grown on layer 180 and an emitter layer 182 is grown on contact layer 181. A base layer 183 is grown on emitter layer 182 and a collector layer 184 is grown on base layer 183. As will be seen presently, layers 181 through 184 form n-p-n transistor 175.

With layers 180 through 184 grown as described, the following layers are grown to complete p-n-p transistor 176. A second emitter layer 185 is grown on collector layer 184 and an emitter contact layer 186 is grown on second emitter layer 185. The collector layer 184 for n-p-n transistor 175 also serves as a base layer for p-n-p transistor 176. Again it should be understood that all of the layers are described as being grown in a single operation because that is considered to be most convenient and requires the fewest inter-growth operations. Also, the continuous growth means the wafer is introduced into the growth chamber only once, which results in the fewest contamination possibilities.

With the growth of the various layers completed, an etch process is performed to define LED array 11 in the central area of substrate 111, using layer 180 as an etch stop. A plurality of surface contacts 190 to conductive layer 112 are formed by converting a vertical pillar 120 to heavily doped N-type conductive material by implanting an impurity through exposed row buses 14 at predetermined positions. In this embodiment the surface contacts are formed in rows and a surface contact is provided for each LED 160 in each row, to reduce the resistance of the connections to the lower contact of each LED 160. It should be understood, however, that some or all of the intermediate vertical pillars could be eliminated and row connections could be made by connections (vertical pillars 120) to conductive layer 112 at predetermined positions in each row bus 14 or, for example, only at the ends of each row bus 14.

In a specific example, vertical pillars 120 are formed by using standard ion implant and implanting mask technology. Donor ions of silicon, Si+, are used but it will be understood that any known donor in this material system (e.g. Se, Te, etc.) could be utilized. The implant dose must be sufficient to convert pillars 120 down through layers 115 and 114 to a p-type conductor. To accomplish the conversion, the implant dose, in one embodiment, is in the range of $10^{14}$ per $cm^2$. A photoresist layer approximately 2.5 microns thick, formed into an implant mask in the usual manner, is sufficient to restrict the implant to vertical pillars 120.

Once the implant of vertical pillars 120 has been completed, the implant is activated with a high temperature anneal. Generally, because of the depth and dosage of the implant, the high temperature anneal requires a temperature in the range of approximately 800° C. to 900° C. The implant of vertical pillars 120 is generally a first step in the process sequence, because subsequent implant and metallization steps (to be explained) generally cannot tolerate this high temperature. Isolation of each LED 160 is achieved by implanting impurity material to form an isolating resistive volume, or moat 125, around each of the defined light emitting areas. Resistive moat 125 laterally confines current flow across the P-N junction (carrier confinement layer 115, active layer 114 and carrier confinement layer 113) of each LED 160 and, therefore, defines the emitting region of each LED 160. The depth of moat 125 ranges from zero depth, in which only cap layer 116 is etched, to well into carrier confinement layer 113, depending upon the desired level of current confinement and the potential negative effects resulting from implanting through the P-N junction of the light emitting diodes (e.g. reliability issues). Corresponding implant energies range from 0 to approximately 200 KeV.

In a specific example, oxygen ions, O+, are utilized as the implanted impurity. It will be understood, however, that many other species including hydrogen (H+), boron (B+), helium (He+), etc. are known to produce resistive regions also. The implant dosage required for adequate isolation varies with the selected implant depth, but is typically in the range of $10^{12}$ to $10^{13}$ per $cm^2$. Generally, a photoresist layer approximately 2.0 microns thick, formed into an implant mask in the usual manner, is sufficient to restrict the implant to moat 125 surrounding each light emitting area. It should be noted that resistive moat 125 also acts to eliminate any parasitic, implanted P-N junctions at the interface between each light emitting diode (P-type carrier confinement layer 115) and N-type vertical pillars 120.

In the present embodiment, exposed row areas and exposed column areas define a matrix of diode light emitting areas, which may, for example, contain as many as 200 or 300 columns and 100 or 200 rows of light emitting diodes, or in some special applications even more. Also, in the described embodiment carrier confinement layer 113 and conductive portion 112 are common to each light emitting diode. This allows the lower terminals (carrier confinement layer 113) of each of the light emitting diodes in each row to be conveniently connected in common. However, in this embodiment it is necessary to isolate the rows of light emitting diodes from each other to prevent crosstalk therebetween. Isolation between rows of LEDs 160 and between LEDs 160 and column and row coding circuits 12 and 15 is provided by isolation implants 130 (only one is illustrated) extending like a substantially continuous wall between each adjacent pair of rows of light emitting diodes and between column and row coding circuits 12 and 15 and the outer row of light emitting diode. Further, implant 130 extends downwardly through carrier confinement layer 115, active layer 114, carrier confinement layer 113 and conductive portion 112 to electrically isolate adjacent rows and circuits from each other.

In a specific example, doubly ionized oxygen ions, O++, are used as the impurity because it allows a minimum implant mask thickness and oxygen implanted GaAs layers retain their resistive properties even after moderate temperature cycling. Since isolation implant 130 extends through conductive layer 112, the depth range of isolation implant 130 may limit the overall thickness of the structure. Doubly ionized oxygen ions have a projected range of about 0.6 microns at 200 KeV. Other ions, such as hydrogen (H+), boron(B+), or helium (He+) may provide greater isolation depths, thereby allowing greater structure thicknesses. Implant doses of approximately $10^{13}$ per $cm^2$ to $10^{14}$ per $cm^2$ have been found to be adequate for the required isolation. A photoresist mask about 3 microns thick is adequate for the isolation implant step.

In a specific example, isolation and etch stop layer 180 for LED and HBT transistors is formed by epitaxially growing a layer of AlGaAs on cap portion 116. Contact layer 181 includes a layer of GaAs, heavily doped to produce n+ conduction, is grown on layer 180 and a layer of InGaP or AlGaAs, lightly doped for n-type conduction, is grown on contact layer 181 to form emitter layer 182. A layer of GaAs, lightly doped to produce p-type conduction, is grown on layer 182 to form base layer 183. A layer of n-doped GaAs is grown on layer 183 to form collector layer 184. Second emitter layer 185 is formed by growing a layer of InGaP or AlGaAs, lightly doped for p-type conduction, on layer 184 and emitter contact layer 186 is formed by growing a layer of GaAs, heavily doped for p+ conduction on second emitter layer 185.

The various layers are etched to provide a contact area on the surface of layer 181 for the positioning of an emitter contact 191 thereon. The various layers are further etched to provide a contact area on the surface of layer 183 for the positioning of a base contact 192 thereon. Layer 184 is then etched to define a collector contact area for a collector contact 193, to complete n-p-n HBT 175. Layer 184 is also etched to partially isolate n-p-n HBT 175 from p-n-p HBT 176 and to provide areas for the base terminals of p-n-p HBT 176.

An isolation wall 194 is formed by implanting material (see the discussion of the formation of resistive moats 125 and isolation implants 130 above) between HBTs 175 and 176. Also, an isolation wall 195 is formed by implanting material adjacent HBT 176. It will be understood that walls 194 and 195 may be formed in the same process as resistive moats 125 and/or isolation implants 130.

A collector contact 196 for p-n-p HBT 176 is positioned on layer 183 between walls 194 and 195. Layers 185 and 186 are etched to provide an area for isolation wall 195 and to provide an area for positioning a base contact 197 thereon. An emitter contact is positioned on the surface of emitter layer 186 to complete p-n-p HBT 176.

The formation of the various contacts for LED 160 and HBTs 175 and 176 is well known in the art and will not be elaborated upon herein. It should be understood however, that at least the p-type contacts are formed in a single metallization step and at least the n-type contacts are formed in a single metallization step. Further, interconnections to connect the LEDs in rows and columns and to connect the transistors in column and row decoders or drivers are generally performed during one of the metallization steps to further reduce the number of steps in the manufacturing process.

Accordingly, methods of manufacturing displays with a substantial reduction in the steps of the manufacturing process have been disclosed. Further, methods of manufacturing displays with simpler and fewer data drivers and with fewer I/O terminals have been disclosed. Because the LED matrix and the driver and/or decoding transistors are fabricated in common steps, the manufacturing process is greatly simplified, reducing the time, materials, and cost required. It will of course be understood that an LED display can be provided with only one of the assembly of column or row decoding switches and the other of the assembly of row or column (these are of course interchangeable) decoding switches can be replaced with normal hardwired connections, some form of decoding, a shift register, or the like.

The various steps of the methods disclosed have been performed in a specific order for purposes of explanation, however, it should be understood that various steps of the disclosed methods may be interchanged and/or combined with other steps in specific applications and it is fully intended that all such changes in the disclosed methods come within the scope of the claims.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What we claim is:

1. Monolithic integrated transistors and a light emitting diode matrix comprising:
   a semiconductor substrate;
   a matrix including a plurality of light emitting diodes organized into a plurality of rows and a plurality of columns, the matrix of light emitting diodes including semiconductor material positioned on the substrate; and
   a row driver including a plurality of transistors with one each transistor coupled to each row of the matrix and a column driver including a plurality of complementary transistors with one each complementary transistor coupled to each column of the matrix, so as to define a driving circuit for each light emitting diode in the matrix, each driving circuit including a transistor of the plurality of transistors coupled to a light emitting diode of the matrix coupled to a complementary transistor of the plurality of complementary transistors in series to complete a series current path the transistors and the complementary transistors each being a heterojunction bipolar transistor including semiconductor material positioned on the semiconductor material forming the matrix.

2. Monolithic integrated transistors and a light emitting diode matrix as claimed in claim 1 including a plurality of row drivers and a plurality of column drivers with each row driver including a heterojunction bipolar transistor and each column driver including a complementary heterojunction bipolar transistor.

3. Monolithic integrated transistors and a light emitting diode matrix as claimed in claim 2 wherein the heterojunction bipolar transistor in the row driver is an n-p-n transistor and the heterojunction bipolar transistor in the column driver is a p-n-p transistor.

4. Monolithic integrated transistors and a light emitting diode matrix as claimed in claim 3 wherein the matrix includes a first plurality of epitaxial layers grown on the substrate, the n-p-n transistor includes a second plurality of layers of semiconductor material epitaxially grown on the first epitaxial layers, and the p-n-p transistor includes a third plurality of layers of semiconductor material epitaxially grown on the second plurality of epitaxial layers.

5. Monolithic integrated transistors and a light emitting diode matrix as claimed in claim 4 wherein the p-n-p transistor is isolated from the n-p-n transistor by resistive implants.

6. Monolithic integrated transistors and a light emitting diode matrix as claimed in claim 4 including an isolation layer positioned between the first plurality of epitaxial layers of semiconductor material and the second plurality of epitaxial layers.

7. Monolithic integrated transistors and a light emitting diode matrix as claimed in claim 4 including an etch stop layer positioned between the first plurality of epitaxial layers of semiconductor material and the second plurality of epitaxial layers.

8. Monolithic integrated transistors and a light emitting diode matrix as claimed in claim 4 wherein the plurality of first epitaxial layers include an InGaP material system on a GaAs substrate.

9. Monolithic integrated transistor drivers and a light emitting diode matrix as claimed in claim 4 wherein the first plurality of layers of semiconductor material includes an InGaP material system on a GaAs substrate.

10. Monolithic integrated transistors and a light emitting diode matrix as claimed in claim 2 wherein the n-p-n transistor is constructed with a collector terminal as an upper layer and the p-n-p transistor is constructed with an emitter terminal as an upper layer.

11. Monolithic integrated transistor drivers and a light emitting diode matrix comprising:

a semiconductor substrate;

a matrix formed on the substrate, the matrix including a plurality of light emitting diodes with each light emitting diode having a first contact and a second contact, the first contacts being organized into a plurality of rows of first contacts and the second contacts being organized into a plurality of columns of second contacts;

a plurality of row driving circuits, each row driving circuit including a heterojunction bipolar transistor having a current carrying terminal coupled to a row of the plurality of rows of first contacts, the heterojunction bipolar transistors being formed on the substrate; and a plurality of column driving circuits, each column driving circuit including a complementary heterojunction bipolar transistor having a voltage supplying terminal coupled to a column of the plurality of columns of second contacts, the complementary heterojunction bipolar transistors being formed on the substrate, so as to define a driving circuit for each light emitting diode in the matrix, each driving circuit including a transistor of the plurality of transistors coupled to a light emitting diode of the matrix coupled to a complementary transistor of the plurality of complementary transistors in series to complete a series current path.

12. Monolithic integrated transistor drivers and a light emitting diode matrix as claimed in claim 11 wherein the heterojunction bipolar transistor in each of the row driving circuits is an n-p-n transistor and the heterojunction bipolar transistor in each of the column driving circuits is an p-n-p transistor.

13. Monolithic integrated transistor drivers and a light emitting diode matrix as claimed in claim 11 wherein each of the n-p-n transistors is constructed with a collector terminal as an upper layer and each of the p-n-p transistors is constructed with an emitter terminal as an upper layer.

14. Monolithic integrated transistor drivers and a light emitting diode matrix as claimed in claim 13 wherein the matrix includes a first plurality of layers of semiconductor material epitaxially grown on the substrate, the n-p-n transistors include a second plurality of layers of semiconductor material epitaxially grown on the first plurality of layers, and the p-n-p transistors include a third plurality of layers of semiconductor material epitaxially grown on the second plurality of layers.

15. Monolithic integrated transistor drivers and a light emitting diode matrix as claimed in claim 14 wherein each of the p-n-p transistors is isolated from each of the n-p-n transistor by resistive implants.

16. Monolithic integrated transistor drivers and a light emitting diode matrix as claimed in claim 14 including an isolation layer positioned between the first plurality of layers of semiconductor material and the second plurality of layers of semiconductor material.

17. Monolithic integrated transistor drivers and a light emitting diode matrix as claimed in claim 14 including an etch stop layer positioned between the first plurality of layers of semiconductor material and the second plurality of layers of semiconductor material.

* * * * *